(12) United States Patent
Lee et al.

(10) Patent No.: US 8,823,139 B2
(45) Date of Patent: Sep. 2, 2014

(54) LOW LEAKAGE DIODES

(71) Applicant: Taiwan Semiconductor Manufacturing Company, Ltd., Hsin-Chu (TW)

(72) Inventors: Jam-Wem Lee, Zhubei (TW); Yi-Feng Chang, Xinbei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/932,831

(22) Filed: Jul. 1, 2013

(65) Prior Publication Data

US 2013/0285209 A1 Oct. 31, 2013

Related U.S. Application Data

(62) Division of application No. 13/030,771, filed on Feb. 18, 2011, now Pat. No. 8,476,736.

(51) Int. Cl.
*H01L 29/861* (2006.01)

(52) U.S. Cl.
USPC ............. 257/547; 257/E29.109; 257/E29.327

(58) Field of Classification Search
None
See application file for complete search history.

(56) References Cited

U.S. PATENT DOCUMENTS

| | | | |
|---|---|---|---|
| 5,156,989 A | 10/1992 | Williams et al. | |
| 5,369,041 A | 11/1994 | Duvvury | |
| 5,495,123 A | 2/1996 | Canclini | |
| 5,728,612 A | 3/1998 | Wei et al. | |
| 5,940,700 A * | 8/1999 | Galbiati et al. | 438/237 |
| 6,737,682 B1 | 5/2004 | Yu | |
| 6,850,397 B2 | 2/2005 | Russ et al. | |
| 7,061,051 B2 | 6/2006 | Yu | |
| 7,081,662 B1 | 7/2006 | Lee et al. | |
| 7,372,083 B2 | 5/2008 | Lee et al. | |
| 7,372,109 B2 | 5/2008 | Chen et al. | |
| 7,385,252 B2 | 6/2008 | Lee et al. | |

(Continued)

OTHER PUBLICATIONS

"Increase the efficiency of your applications," Schottky diodes (<200 mA):: NXP Semiconductors, NXP Buy Schottky diodes (<200 mA); http:www.nxp.com/products/diodes/general_purpose_schottky_diodes_250_ma; printed Nov. 29, 2012; 2 pages.

(Continued)

*Primary Examiner* — Davienne Monbleau
*Assistant Examiner* — Joseph Schoenholtz
(74) *Attorney, Agent, or Firm* — Slater and Matsil, L.L.P.

(57) ABSTRACT

A diode includes an anode of a first conductivity type; a first cathode of the first conductivity type; and a second cathode of a second conductivity type opposite the first conductivity type. A lightly-doped region of the first conductivity type is under and vertically overlaps the anode and the first and the second cathodes. The portion of the lightly-doped region directly under the second cathode is fully depleted at a state when no bias voltage is applied between the anode and the second cathode.

14 Claims, 4 Drawing Sheets

(56) References Cited

U.S. PATENT DOCUMENTS

| | | |
|---|---|---|
| 7,436,043 B2 | 10/2008 | Sung et al. |
| 7,566,595 B2 | 7/2009 | Steinhoff |
| 7,701,012 B2 | 4/2010 | Xu et al. |
| 7,808,069 B2 | 10/2010 | Ho et al. |
| 7,843,002 B2 | 11/2010 | Wei et al. |
| 8,236,642 B2 | 8/2012 | Wei et al. |
| 8,390,092 B2 | 3/2013 | Gendron et al. |
| 8,476,736 B2 | 7/2013 | Lee et al. |
| 2007/0052057 A1 | 3/2007 | Drobny |
| 2007/0241426 A1* | 10/2007 | Hiroshima et al. ........... 257/565 |
| 2009/0250759 A1* | 10/2009 | Otake ........................... 257/356 |
| 2011/0207409 A1 | 8/2011 | Ker et al. |

OTHER PUBLICATIONS

Zeghbroeck, B. Van, "Principles of Semiconductor Devices," Electrostatic analysis, http://ecee.colorado.edu/-bart/book/chapter3/ch3_3.html; Nov. 2012, 1 page.

Robinson, Lee "How to select effective ESD protection diodes," EE Times Design, http://www.eetimes.com/design/automotive-design/4016323, 4 pages, printed Nov. 29, 2012.

"An NXP Best Efficiency Schottky Technology (BEST) power diode with voltage stress protection," Power schottky diodes::NXP Semiconductors, NXP—Buy Power schottky diodes, http://www.nxp.com/products/diodes/power_schottky_diode, printed Nov. 29, 2012; 1 page.

\* cited by examiner

LOW LEAKAGE DIODES

This application is a divisional of U.S. patent application Ser. No. 13/030,771, filed Feb. 18, 2011, and entitled "Low Leakage Diodes," which application is incorporated herein by reference.

BACKGROUND

Diodes may be used for isolation purposes. For example, in Local Interconnect Network Bus-systems (LINBus) that are often used in cars, diodes may be used to isolate batteries to prevent leakage.

A conventional isolation diode may be built as a part of an integrated circuit, which includes a p-type substrate and an N-type Buried Layer (NBL) over the substrate. The anode of the diode may include a High-Voltage P-type Well (HVPW) over the NBL and a P+ region over the HVPW. The cathode of the diode may include a High-Voltage N-type Well (HVNW) over the NBL and an N+ region over the HVNW. To prevent the cathode from being directly connected to the NBL, a Deep P-Well (DPW) may be formed at a middle level or a bottom level of the HVNW, so that the cathode, which is of N type, is isolated from the NBL by the DPW.

The conventional isolation diode, however, suffers from leakage currents when the diode is forwardly biased. The anode (p-type), the NBL, and the p-type substrate form a PNP bipolar junction transistor, which may be turned on when the diode is forwardly biased. Accordingly, a leakage current may flow from the anode to the substrate.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A diode with a reduced leakage and a high breakdown voltage is provided in accordance with an embodiment. The method of forming the same is also provided. The variations and the operation of the embodiment are then discussed. Throughout the various views and illustrative embodiments, like reference numbers are used to designate like elements.

Figure 1:
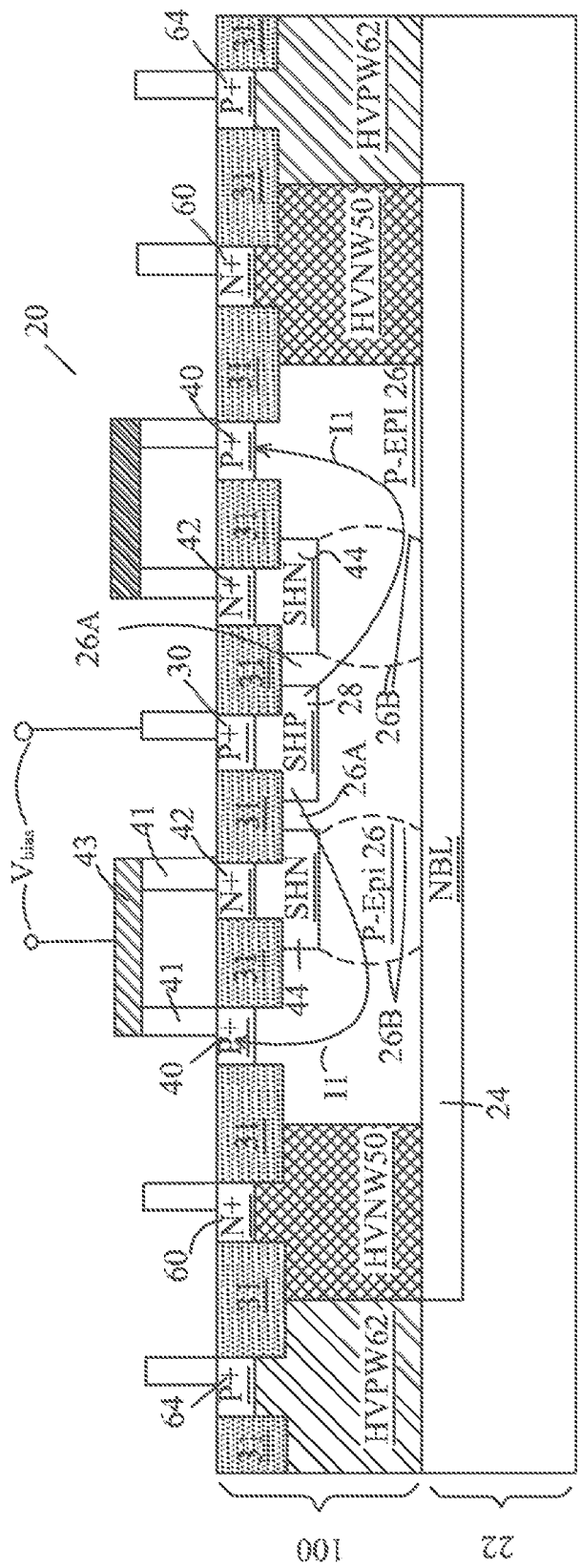
FIG. 1 illustrates a cross-sectional view of a diode in accordance with an embodiment, wherein the diode is formed over a p-type substrate.

FIG. 1 illustrates a cross-sectional view of diode 20 in accordance with an embodiment. Diode 20 is formed on substrate 22, which may be a p-type substrate that is lightly doped with a p-type impurity. N-type Buried Layer (NBL) 24 is formed at a top surface of substrate 22. In an embodiment, NBL 24 is formed by implanting a top portion of substrate 22 with an n-type impurity.

Lightly-doped p-type region 26 is formed over NBL 24. In an embodiment, lightly-doped p-type region 26 is formed by epitaxially growing semiconductor layer 100 over substrate 22. Accordingly, throughout the description, lightly-doped p-type region 26 is alternatively referred to as being p-epi region 26, although lightly-doped p-type region 26 may also be formed through implantation in some embodiments. With the proceeding of the epitaxial growth of the semiconductor layer 100, a p-type impurity may be in-situ doped, so that the p-type impurity concentration of p-epi region 26 may be low. As a result, unlike the p-type regions formed of implantation, p-epi region 26 may have a substantially uniform doping concentration, which may be lower than the p-type doping concentration of substrate 22. The differences in doping concentrations of the top portion, the intermediate portion, and the bottom portion of p-epi region 26 may be smaller than about 10 percent. The bottom surface of p-epi region 26 contacts the top surface of NBL 24.

The anode of diode 20 includes Shallow P-well (SHP) region 28. Heavily doped p-type (P+) region 30 is formed over and contacting SHP region 28. In the described embodiments, heavily doped (indicated using symbol "+") means an impurity concentration above about $10^{19}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments. In an embodiment, the bottom of SHP region 28 may extend to below the bottom surface of isolation regions 31, which may be shallow trench isolation (STI) regions extending into semiconductor layer 100.

The cathode of diode 20 includes P+ cathode 40 and heavily doped n-type (N+) cathode 42. P+ cathode 40 and N+ cathode 42 are interconnected, and are used as a single cathode. Accordingly, P+ cathode 40 and N+ cathode 42 are in combination referred to as being cathodes 40/42 hereinafter. The interconnection of P+ cathode 40 and N+ cathode 42 may be achieved through metallic connections including, for example, contact plugs 41 and metal line(s) 43, which are formed in the metal layer over diode 20. Due to the metallic connections, P+ cathode 40 and N+ cathode 42 are at the same voltage level when diodes 20 is operated. In an embodiment, Shallow N-well (SHN) 44 is formed between and contacting N+ cathode 42 and p-epi region 26. In alternative embodiments, SHN region 44 is not formed, and p-epi region 26 contacts the bottom of N+ cathode 42.

SHN region 44 is spaced apart from NBL 24 by a portion (marked as 26B) of p-epi region 26. The bottom surface of SHN region 44 is higher than bottom surface of N-Well (HVNW) 50, and may, or may not, be lower than the bottom surface of STI regions 31. In an embodiment, SHN region 44 has an n-type doping concentration greater than the doping concentration of p-epi region 26 and the n-type doping concentration of HVNW 50. In alternative embodiments, the doping concentration of SHN region 44 may also be substantially equal to the doping concentration of p-epi region 26.

SHP region 28 is spaced apart from NBL 24 by a portion of p-epi region 26, and the bottom surface of SHP region 28 is higher than bottom surface of HVNW 50. In an embodiment, SHP region 28 has a p-type doping concentration greater than the doping concentration of p-epi region 26 and the n-type doping concentration of HVNW 50. In alternative embodiments, the doping concentration of SHP region 28 may also be substantially equal to the doping concentration of HVNW 50. SHP region 28 and SHN region 44 may be spaced apart from each other by portion 26A of p-epi region 26.

Since p-epi region 26 contacts NBL 24 and SHN region 44, depletion regions (not shown) are formed in p-epi region 26 when no bias voltage (the bias voltage is 0V) is applied between anode 30 and cathodes 40/42. The depletion regions include a first depletion region in a lower part of portion 26B of p-epi region 26, wherein the first depletion region is formed due to the P-N junction of p-epi region 26 and NBL 24. The depletion regions also include a second depletion region in an upper part of portion 26B of p-epi region 26, wherein the second depletion region is formed due to the P-N junction between p-epi region 26 and SHN 44. The second depletion region expands if a reverse bias voltage is applied between anode 30 and cathodes 40/42. The doping concentration of p-epi region 26 is low, so that the first and the second depletion regions join each other even when no bias voltage is applied between anode 30 and cathodes 40/42. It is observed that there exists a p-type path formed of p-epi region 26 and SHP region 28, which p-type path has a first end contacting P+ cathode 40, and a second end contacting anode 30. All regions in the p-type path are of p-type, with no n-type regions therein. Accordingly, the depletion regions cuts apart the p-type path, and electrically isolates P+ cathode 40 from anode 30 when no bias voltage is applied or when a reverse bias voltage is applied.

HVNW 50 is also formed over and contacting NBL 24. HVNW 50 and NBL 24 in combination form an isolation structure having a basin shape, wherein the isolation structure isolates diode 20 therein from p-type substrate 22. N+ region 60 may be formed at the surface of HVNW 50. Furthermore, outside HVNW 50, HVPW 62 and P+ region 64 may be formed, with P+ region 64 being the pickup region of p-type substrate 22.

Figure 2:
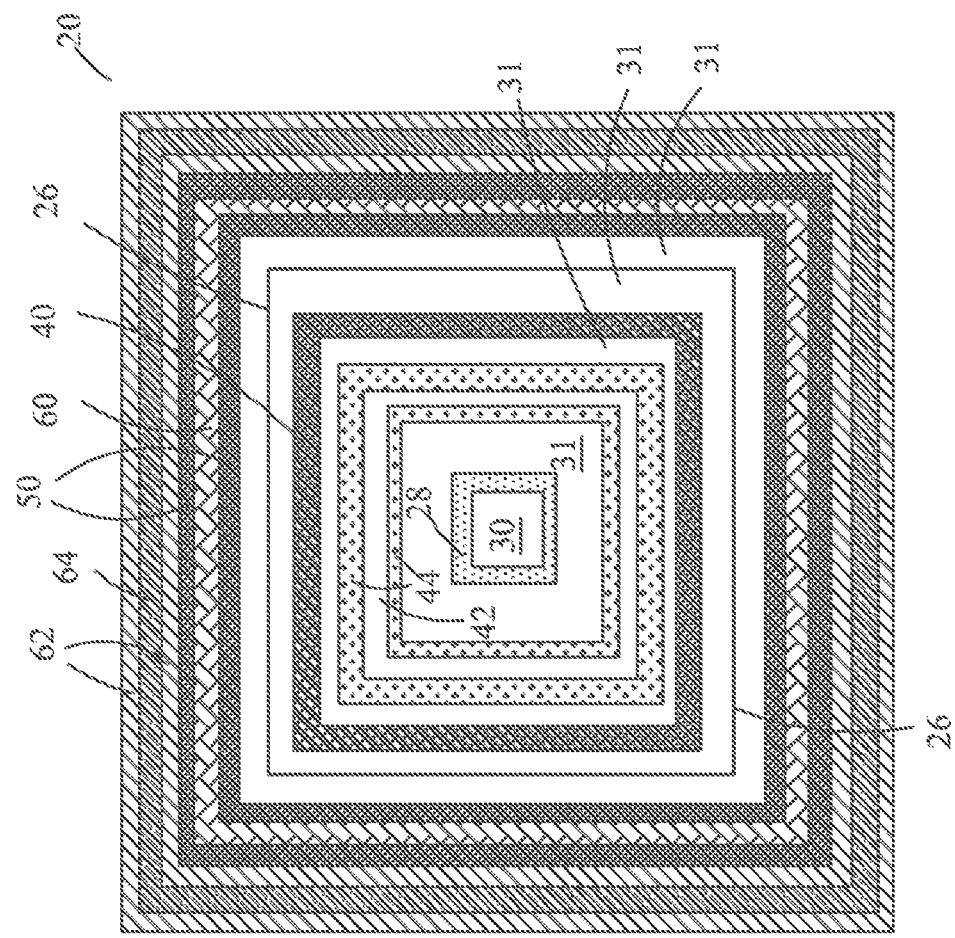
FIG. 2 illustrates an exemplary top view of the diode as shown in FIG. 1.

FIG. 2 illustrates a top view of the structure in FIG. 1. It is noted that FIG. 2 is an exemplary top view, and diode 20 may have different top views, wherein regions 28, 30, 40, 42, and 44 may be arranged to have different layouts. In the exemplary embodiment as shown in FIG. 2, each of SHN region 44 and N+ cathode 42 forms a ring encircling anode 30 and SHP region 28. P+ cathode 40 further forms a ring encircling the rings of SHN region 44 and N+cathode 42. HVNW 50 may also form a ring encircling the rings formed of P+ cathode 40, SHN region 44, and N+ cathode 42. Outside the ring formed of HVNW 50, HVPW 62 and P+ region 64 may form additional rings.

Referring back to FIG. 1, when diode 20 is forwardly biased, bias voltage Vbias is applied between anode 30 and cathodes 40/42, with the voltage on anode 30 being higher than the voltage on cathodes 40/42. Accordingly, before the p-n junction between p-epi region 26 and SHN region 44 is turned on (for example, when voltage Vbias is smaller than 0.6V), forward current I1, if any, will flow from anode 30 to p-epi region 26, and to P+ cathode 40. This converts the otherwise leakage current that would have flown to NBL 24 and p-type substrate 22 into the forward bias current. When the p-n junction between p-epi region 26 and SHN region 44 is turned on (for example, when voltage Vbias is greater than about 0.6V), the forward current flows to both P+ cathode 40 and N+ cathode 42.

When bias voltage Vbias is equal to 0V, or is a negative (reverse) bias voltage, the depletion regions in the fully depleted portion(s) 26B of p-epi region 26 prevent any reverse leakage currents from flowing from P+ cathode 40 to anode 30. Furthermore, when diode 20 is reversely biased, no current flows from N+ cathode 42 to anode 30 since the p-n junction between p-epi region 26 and SHN region 44 is reversely biased. Accordingly, regardless whether diode 20 is forwardly or reversely biased, no leakage current between P+ cathode 40 and anode 30 flows through p-epi region 26. As a result, diode 20 has very small leakage currents when biased forwardly or reversely.

A formation process of the structure as shown in FIG. 1 is briefly discussed as follows. In an embodiment, p-type substrate 22 is provided, and NBL 24 is formed by implanting a surface portion of p-type substrate 22. Next, epitaxial layer 100 is epitaxially grown on p-type substrate 22 and NBL 24, wherein the p-type impurities are in-situ doped, so that the resulting p-epi region 26 has a desirable low impurity concentration, which may be higher than, equal to, or lower than, the impurity concentration of p-type substrate 22. Next, HVNW 50, HVPW 62, SHN region 44, SHP region 28, P+ regions 30, 40, and 64, and N+ regions 42 and 60 are formed by implanting epitaxial layer 100 with the respective p-type or n-type impurities. The implantations of SHN region 44 and SHP region 28 may be performed simultaneously with the implantations of low-voltage n-wells and low-voltage p-wells, respectively, so that the manufacturing cost is lowered. STI regions 31 may be formed by etching epitaxial layer 100 to form recesses, and filling the recesses with dielectric materials. In alternative embodiments, instead of forming epitaxial layer 100, the p-type and n-type regions as shown in FIG. 1 may be formed by implanting p-type substrate 22.

Figure 3:
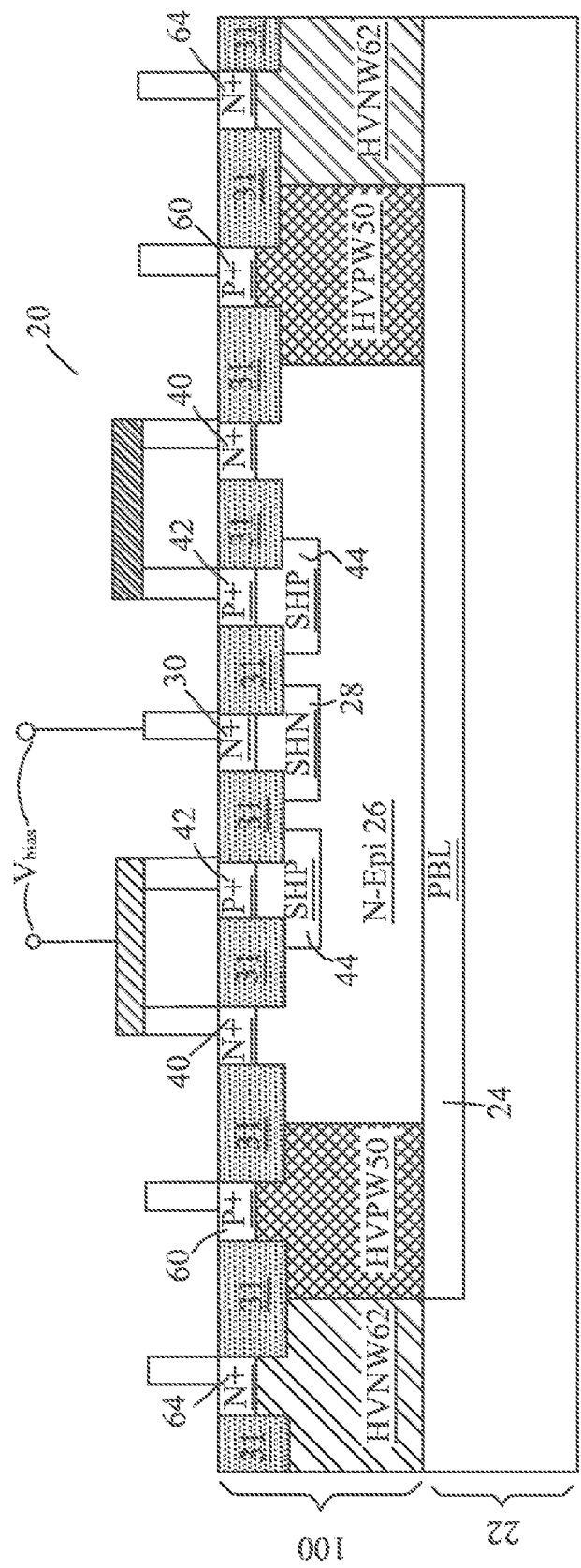
FIG. 3 illustrates a cross-sectional view a diode in accordance with an alternative embodiment, wherein the diode is formed over an n-type substrate.

Although the above-discussed embodiments provide diodes formed on p-type substrates, one skilled in the art will realize that the teaching as provided is readily available for the formation of diodes on n-type substrates, with the conductivity types of the respective p-type and n-type regions as shown in FIG. 1 inverted. FIG. 3 illustrates an exemplary diode 20 formed on n-type substrate 22. The naming of the regions (such as PBL, which indicates p-type buried layer) in FIG. 3 reflects their conductivity types. The impurity concentrations and operation may be derived by applying the teaching in the above-disclosed embodiments.

Figure 4:
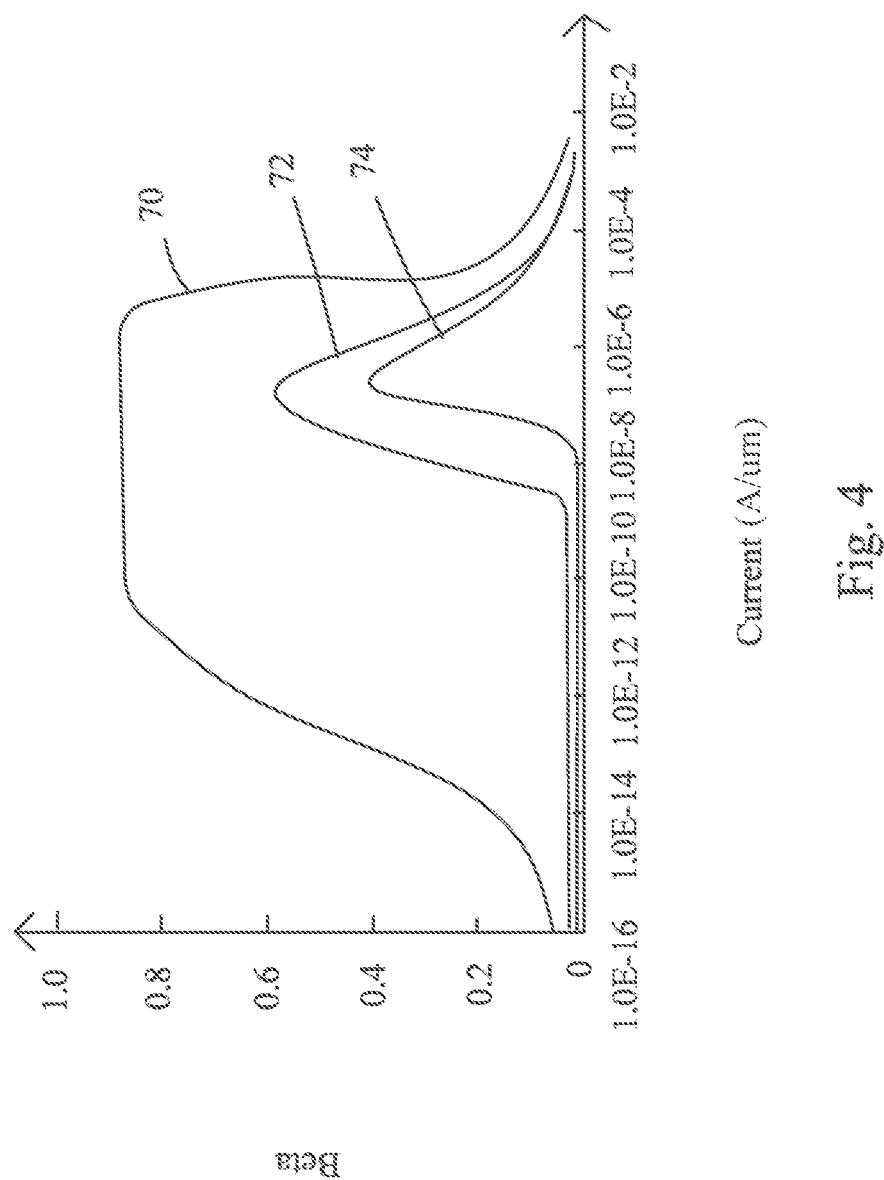
FIG. 4 illustrates a simulation result, wherein the beta gains of diodes are illustrated as a function of the injected currents.

FIG. 4 illustrates simulation results, wherein the beta gains of diodes 20 (FIG. 1) are illustrated as a function of the respective injected currents. The beta gains, which are the ratios of the currents flowing into substrate 22 to the respective anode currents, reflect the leakage currents. Line 70 reflects the beta gain of a conventional diode adopting a Deep P-Well (DPW) to separate a HVNW region (which connects to the respective cathode) from the underlying NBL, wherein the conventional diode doesn't have the p-epi region 26 and the P+ cathode. Line 72 reflects the beta gain of diode 20 as shown in FIG. 1. It is found that the beta gain of the embodiment (FIG. 1) is significantly lowered compared to that of the conventional diodes, with over 40 percent improvement observed. Line 74 illustrates a further reduced beta gain of diode 20 when the process conditions and parameters of diode 20 are further adjusted. Additional simulation results (not shown) also revealed that the breakdown voltages of the diodes in accordance with embodiments may be reliably greater than 60V.

In accordance with embodiments, a diode includes an anode of a first conductivity type; a first cathode of the first conductivity type; and a second cathode of a second conductivity type opposite the first conductivity type. A lightly-doped region of the first conductivity type is under and vertically overlaps the anode and the first and the second cathodes. The portion of the lightly-doped region directly under the second cathode is fully depleted at a state when no bias voltage is applied between the anode and the second cathode.

In accordance with other embodiments, a diode includes an anode of a first conductivity type; a first cathode of the first conductivity type; and a second cathode of a second conductivity type opposite the first conductivity type. The first and the second cathodes are interconnected through a metal connection. A path interconnects the anode and the first cathode, wherein all regions in the path are of the first conductivity type. A lightly-doped region of the first conductivity type is under the anode and the first and the second cathodes, wherein the lightly-doped region forms a part of the path.

In accordance with yet other embodiments, a device includes a p-type substrate, an n-type buried layer over the p-type substrate, and a diode. The diode includes a lightly doped p-type region over the n-type buried layer; an anode over the lightly doped p-type region; a shallow p-type region between and contacting the lightly doped p-type region and the anode; a first cathode of n-type over the lightly doped p-type region; and a shallow n-type region between and contacting the lightly doped p-type region and the first cathode. The shallow p-type region and the shallow n-type region are spaced apart from each other by a portion of the lightly doped p-type region. The diode further includes a second cathode of p-type over and contacting the lightly doped p-type region, wherein the first and the second cathodes are interconnected to be at a same voltage level. A high-voltage N-well encircles the lightly doped p-type region, wherein a bottom of the high-voltage N-well contacts the n-type buried layer, and wherein the high-voltage N-well encircles the lightly doped p-type region, the anode, and the first and the second cathodes.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
 a diode comprising:
  an anode of a first conductivity type;
  a first cathode of the first conductivity type;
  a second cathode of a second conductivity type opposite the first conductivity type; and
  a lightly-doped region of the first conductivity type under and vertically overlapping the anode and the first cathode and the second cathode, wherein a portion of the lightly-doped region directly under the second cathode is fully depleted at a state when no bias voltage is applied between the anode and the second cathode.

2. The device of claim 1, wherein the first and the second cathodes are interconnected to act as a single cathode.

3. The device of claim 1 further comprising a shallow well region of the first conductivity type underlying and contacting the anode, and overlying and contacting the lightly-doped region.

4. The device of claim 1 further comprising a shallow well region of the second conductivity type underlying and contacting the second cathode, and overlying and contacting the lightly-doped region.

5. The device of claim 1 further comprising:
 a buried layer of the second conductivity type underlying and contacting the lightly-doped region; and
 a high-voltage well region of the second conductivity type over and contacting the buried layer, wherein the high-voltage well region forms a ring encircling the lightly-doped region.

6. The device of claim 1, wherein the first conductivity type is p-type, and the second conductivity type is n-type.

7. The device of claim 1, wherein the first conductivity type is n-type, and the second conductivity type is p-type.

8. A device comprising:
 a diode comprising:
  an anode of a first conductivity type;
  a first cathode of the first conductivity type;
  a second cathode of a second conductivity type opposite the first conductivity type, wherein the first and the second cathodes are interconnected through a metal connection, and wherein a path interconnects the anode and the first cathode, with all regions in the path being of the first conductivity type; and
  a lightly-doped region of the first conductivity type under the anode and the first and the second cathodes, wherein the lightly-doped region forms a part of the path.

9. The device of claim 8, wherein a portion of the lightly-doped region directly under the second cathode is fully depleted at a state when no bias voltage is applied between the anode and the first and second cathodes.

10. The device of claim 8 further comprising a shallow well region of the first conductivity type underlying and contacting the anode, and overlying and contacting the lightly-doped region.

11. The device of claim 8 further comprising a shallow well region of the second conductivity type underlying and contacting the second cathode, and overlying and contacting the lightly-doped region.

12. The device of claim 8 further comprising:
 a buried layer of the second conductivity type underlying and contacting the lightly-doped region; and
 a high-voltage well region of the second conductivity type over and contacting the buried layer, wherein the high-voltage well region forms a ring encircling the lightly-doped region.

13. The device of claim 8, wherein the first conductivity type is p-type, and the second conductivity type is n-type.

14. The device of claim 8, wherein the first conductivity type is n-type, and the second conductivity type is p-type.

* * * * *